(12) United States Patent
Zou et al.

(10) Patent No.: US 10,977,982 B2
(45) Date of Patent: Apr. 13, 2021

(54) DISPLAY PANEL AND ELECTRONIC DEVICE HAVING STACKED DATA LINES IN NON-DISPLAY REGIONS AND ALTERNATELY EXTENDING SCANNING LINES

(71) Applicant: Xiamen Tianma Micro-Electronics Co., Ltd., Xiamen (CN)

(72) Inventors: Zongjun Zou, Xiamen (CN); Min Huang, Xiamen (CN); Ying Sun, Xiamen (CN); Yumin Xu, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/590,055

(22) Filed: Oct. 1, 2019

(65) Prior Publication Data
US 2020/0342802 A1    Oct. 29, 2020

(30) Foreign Application Priority Data
Apr. 28, 2019   (CN) .......................... 201910351269.7

(51) Int. Cl.
*G09G 3/20*     (2006.01)
*G09G 3/3258*   (2016.01)
*H01L 27/32*    (2006.01)

(52) U.S. Cl.
CPC ......... *G09G 3/2003* (2013.01); *G09G 3/3258* (2013.01); *H01L 27/3213* (2013.01);
(Continued)

(58) Field of Classification Search
CPC ............... G09G 3/2003; G09G 3/3258; G09G 2300/0452; G09G 2320/0209;
(Continued)

(56) References Cited

U.S. PATENT DOCUMENTS 6,429,842 B1    8/2002  Shin et al.
2005/0231447 A1* 10/2005 Hu ....................... H01L 27/3218
                                                              345/76
(Continued)

FOREIGN PATENT DOCUMENTS

CN         1806190 A    7/2006
CN       104238217 A   12/2014
(Continued)

OTHER PUBLICATIONS

Chinese Office Action for application No. 201910351269.7; dated Sep. 24, 2020.

*Primary Examiner* — Darlene M Ritchie
(74) *Attorney, Agent, or Firm* — Miller, Matthias & Hull, LLP

(57) ABSTRACT

Disclosed are a display panel and an electronic device. The display panel includes: a base substrate, a first non-display region, a display region surrounding the first non-display region, multiple data lines and multiple scanning lines. The display region includes multiple pixels each including m sub-pixels. In the first non-display region, at least two data lines are stacked and insulated from each other, and orthogonal projections of the at least two data lines on the base substrate are at least adjacently disposed. The multiple scanning lines do not intersect each other. At least two scanning lines each include a first scanning lead. The first scanning lead extends alternately in the first and second directions and is electrically connected to multiple pixels through first sides of the multiple pixels.

18 Claims, 5 Drawing Sheets

(52) U.S. Cl.
CPC . *H01L 27/3276* (2013.01); *G09G 2300/0426* (2013.01); *G09G 2300/0452* (2013.01); *G09G 2320/0209* (2013.01); *G09G 2320/0242* (2013.01)

(58) Field of Classification Search
CPC .............. G09G 2320/0242; G09G 3/32; H01L 27/3213; H01L 27/3276; H01L 27/3211
See application file for complete search history.

(56) References Cited

U.S. PATENT DOCUMENTS

| | | | | |
|---|---|---|---|---|
| 2015/0084941 | A1* | 3/2015 | He | G09G 3/3614 |
| | | | | 345/209 |
| 2016/0370919 | A1* | 12/2016 | Xu | G06F 3/0412 |
| 2017/0023833 | A1* | 1/2017 | No | G02F 1/134309 |
| 2017/0162637 | A1* | 6/2017 | Choi | H01L 27/3246 |
| 2017/0184933 | A1* | 6/2017 | Wang | G09G 3/3648 |
| 2017/0269746 | A1* | 9/2017 | He | G06F 3/0446 |
| 2017/0288002 | A1* | 10/2017 | Kim | H01L 51/0097 |
| 2020/0168691 | A1* | 5/2020 | Choi | H01L 51/5275 |

FOREIGN PATENT DOCUMENTS

| | | |
|---|---|---|
| CN | 108807426 A | 11/2018 |
| JP | 2006106062 A | 4/2006 |

\* cited by examiner

DISPLAY PANEL AND ELECTRONIC DEVICE HAVING STACKED DATA LINES IN NON-DISPLAY REGIONS AND ALTERNATELY EXTENDING SCANNING LINES

CROSS-REFERENCES TO RELATED APPLICATIONS

This application claims priority to Chinese patent application No. 201910351269.7 filed on Apr. 28, 2019, the disclosure of which is incorporated herein by reference in its entirety.

TECHNICAL FIELD

The embodiments of the present disclosure relate to the display technology, and in particular, relate to a display panel and an electronic device.

BACKGROUND

At present, the consumer product market is dominated by full screen, which refers to a display screen having a high screen-to-body ratio. Therefore, how to further improve the screen-to-body ratio of the full screen has also become a popular development direction for the current display screen. Based on this, a holed full screen is proposed. This holed full screen includes two schemes. In one scheme, the full screen is provided a hole running through the full screen. In the other scheme, the full screen has an area (for example a circular area) without display function. The area without display function is transparent and looks like a hole. The holed full screen has a high screen-to-body ratio and can facilitate the arrangement of a camera and other accessories.

For the holed display screen, a camera and other function accessories may be placed at the holed position and the use of the full screen technology can achieve a better display effect. However, in the manufacturing process of the full screen with a "hole" in the display region, the distance between the data lines in the hole region is very small, so that a large parasitic capacitance is generated and crosstalk exists between sub-pixels which are not charged simultaneously, causing display color difference and even vertical lines in a worse pattern.

SUMMARY

The embodiments of the present disclosure provide a display panel and an electronic device, to reduce or eliminate the display color difference.

Embodiments of the present disclosure provide a display panel. The display panel includes: a base substrate, a first non-display region, a display region located on a periphery of the first non-display region, a plurality of data lines arranged along a first direction and a plurality of scanning lines arranged along a second direction. The first direction and the second direction intersect.

The display region includes a plurality of pixels arranged in columns and rows. Each pixel includes m sub-pixels, where lights emitted by the m sub-pixels are of different colors. Each sub-pixel is located between adjacent scanning lines and between adjacent data lines. The sub-pixels of the a plurality of pixels are also arranged in columns and rows. Sub-pixels in the same column are electrically connected to a respective one of the plurality of data lines, and m is equal to 3 or 4.

In the first non-display region, at least two data lines are arranged in different layers and stacked, and are insulated from each other. Orthogonal projections of the at least two data lines on a plane of the base substrate are at least adjacently disposed.

The plurality of scanning lines do not intersect each other. At least two scanning lines each include a first scanning lead. For at least one row of pixels, two adjacent pixels are respectively connected to two adjacent first scanning leads, and the first scanning lead extends alternately in the first direction and the second direction and is electrically connected to pixels via their first sides.

Embodiments of the present disclosure further provide an electronic device. The display panel includes the display panel described above.

In the embodiments provided by the present disclosure, the scanning line includes a first scanning lead, which is arranged to extend alternately in the first direction and the second direction. when the potential of the data line of the charged sub-pixel is in a floating state, the influence of the potential jumping of other adjacent data lines, which do not perform charging simultaneously with the data line of the charged sub-pixel, on the data line of the charged sub-pixel can be mutually counteracted, so the potential of the data line of the charged sub-pixel remains almost unchanged, avoiding the mutual interference between the sub-pixels of different colors which are not simultaneously charged, reducing display color differences caused by large overlapping capacitance of the data lines, and improving the display effect of a full screen with a round hole.

BRIEF DESCRIPTION OF DRAWINGS

In order to more clearly illustrate the technical solutions of embodiments of the present disclosure, a brief introduction to the drawings required in the description of the embodiments or the related art will be given below. Apparently, the drawings described below illustrate part of the embodiments of the present disclosure, and other drawings can be acquired by those skilled in the art without any inventive work.

DETAILED DESCRIPTION

In order to make the objects, technical solutions and advantages of the present disclosure clearer, the technical solutions of the present disclosure will be described below in detail in conjunction with the drawings in the embodiments of the present disclosure and the specific embodiments. Apparently, the described embodiments are part, not all, of the embodiments of the present disclosure, and based on the embodiments of the present disclosure, other embodiments acquired by those skilled in the art on the premise that no creative work is done are within the scope of the present disclosure.

Figure 1:
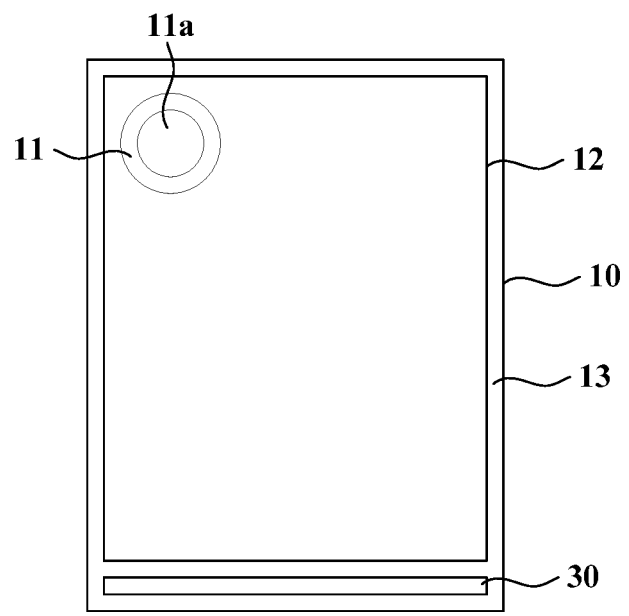
FIG. 1 is a schematic diagram of a display panel according to an embodiment of the present disclosure.
Figure 2:
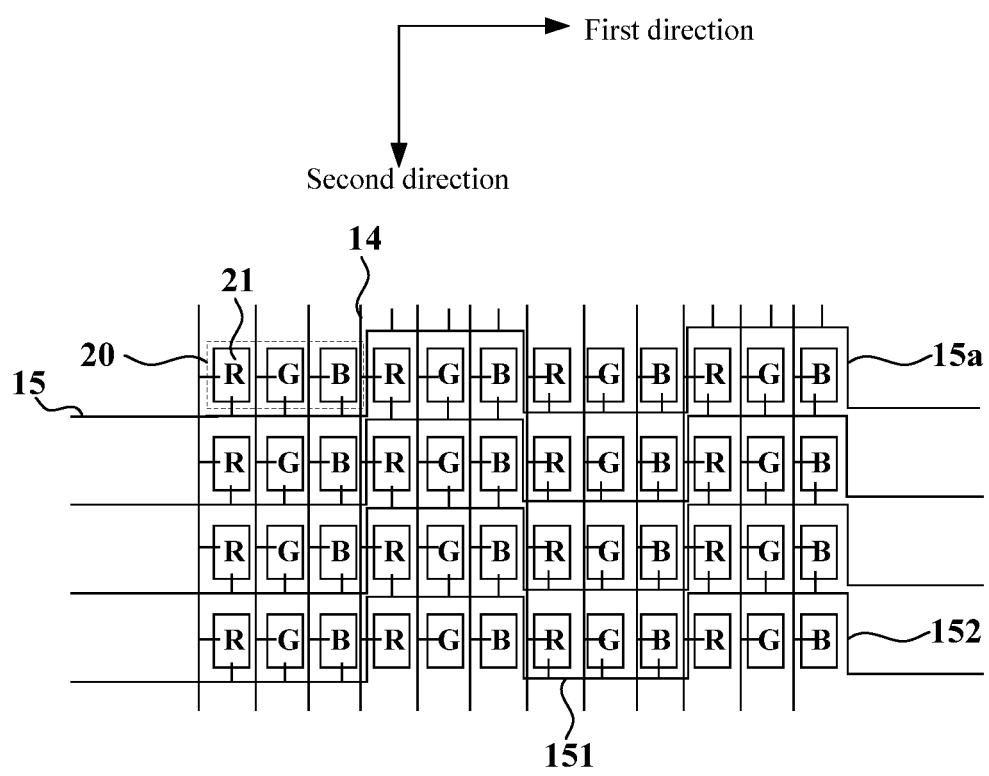
FIG. 2 is a schematic diagram of a part of the display panel shown in FIG. 1.
Figure 3:
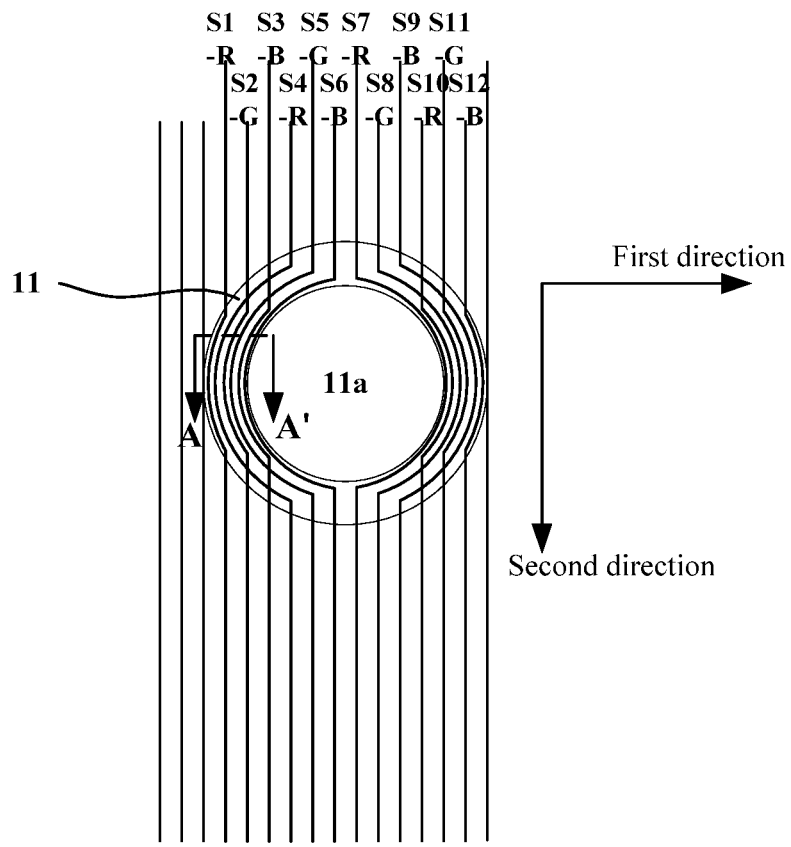
FIG. 3 is a schematic diagram of a first non-display region of the display panel shown in FIG. 1.
Figure 4:
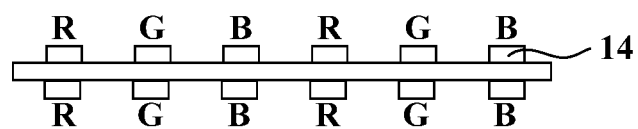
FIG. 4 is a cross-sectional view taken along the a line A-A' in FIG. 3.
Figure 5:
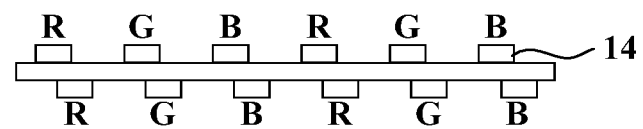
FIG. 5 is a cross-sectional view taken along the line A-A' in FIG. 3.
Figure 6:
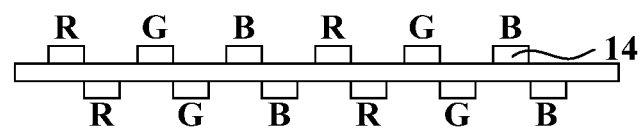
FIG. 6 is a cross-sectional view taken along the line A-A' in FIG. 3.

FIG. 1 is a schematic diagram of a display panel according to an embodiment of the present disclosure. FIG. 2 is a schematic diagram showing a part the display panel shown in FIG. 1. FIG. 3 is a schematic diagram of a first non-display region of the display panel shown in FIG. 1. FIGS. 4 to 6 are cross-sectional views of the display panel taken along the line A-A' in FIG. 3, The display panel provided in the embodiment of the present disclosure includes a base substrate 10, a first non-display region 11, a display region 12 located on a periphery of the first non-display region 11, a plurality of data lines 14 arranged in a first direction and a plurality of scanning lines 15 arranged in a second direction. In some embodiments, the display panel provided further includes a second non-display region 13 located on a periphery of the display region 12. The first direction and the second direction intersect. The display region 12 includes a plurality of pixels 20, and each pixel 20 includes m sub-pixels 21 configured to emit lights in different colors. Each sub-pixel 21 is located between two adjacent scanning lines 15 and between two adjacent data lines 14. The stab-pixels 21 of the plurality of pixels 20 are arranged in rows and columns. The sub-pixels 21 in the same column are electrically connected to a respective one of the plurality of data lines 14. m is equal to 3 or 4. In the first non-display region 11, at least two data lines 14 are arranged in different layers. The at least two data lines 14 are stacked and insulated from each other, and orthogonal projections of the at least two data lines 14 on a plane of the base substrate 10 are at least adjacently disposed. The plurality of scanning lines 15 do not intersect each other, and at least one scanning line 15 includes a first scanning lead 15a, For at least one row of pixels 20, two adjacent pixels 20 are respectively connected to two adjacent first scanning leads 15a. The first scanning lead 15a extends alternately in the first direction and the second direction. In one or more embodiments, the first scanning lead 15a includes a plurality of first connection line segments 151 extending in the first direction and a plurality of second connection line segments 152 extending in the second direction. The plurality of first connection line segments 151 are alternately connected with the plurality of second connection line segments 152. The first scanning lead 15a is electrically connected to one or more of the plurality of pixels 20. Each pixel 20 has a first side and a second side opposite to the first side. The first scanning lead 15a is electrically connected to the one or more pixels 20 at the first sides of the one or more pixels 20.

In the embodiment, optionally, m is equal to 3, and the pixel 20 includes a red sub-pixel R, a green sub-pixel G, and a blue sub-pixel B. In other embodiments, optionally, m is equal to 4, and the pixel 20 includes a red sub-pixel, a green sub-pixel, a blue sub-pixel and a white sub-pixel. It should be understood by those skilled in the art that the number of sub-pixels in the pixel and the colors of the lights emitted by the sub-pixels are not limited in the present disclosure. In other embodiments, optionally, the pixel may further include a red sub-pixel, a green sub-pixel, a blue sub-pixel, and a yellow sub-pixel.

In the embodiment, as shown in FIG. 2, each pixel has an upper side and a lower side in the second direction. Option-ally, in the display panel, the first scanning lead 15a is electrically connected to the lower sides of the one or more pixels 20 electrically connected to the first scanning lead 15a. Specifically, the first scanning lead 15a is electrically connected to the lower side of each sub-pixel 21 electrically connected to the first scanning lead 15a. In other embodiments, optionally, in the display panel, the first scanning lead may be electrically connected to the upper sides of the sub-pixels in each pixel electrically connected to the first scanning lead 15a.

In the embodiment, optionally, the display panel is an organic light emitting display panel, the base substrate 10 is an array substrate. It should be understood by those skilled in the art that the display panel includes, but is not limited to, the organic light emitting display panel, and any type of "holed" display panel falls within the scope of the present disclosure, the base substrate is a substrate structure for constituting the display panel, and specific structures of the display panel and the base substrate are not limited herein.

In the embodiment, the display region 12 surrounds the first non-display region 11, and the first non-display region 11 surrounds a hollow region 11a. Optical devices such as the camera of the display panel may be arranged in the hollow region 11a, so that the full screen of the display panel can be achieved. Elements such as the data lines connected to the sub-pixels 21 may be arranged in the first non-display region 11. Optionally, the hollow region 11a of the display panel is circular. In other embodiments, the hollow region of the display panel may further be in other shapes, such as in a square, and the shape of the hollow region of the display panel is not specifically limited in the present disclosure.

In the embodiment, the display region 12 of the display panel includes: a plurality of pixels 20 each including a plurality of sub-pixels 21, a plurality of data lines 14 arranged in the first direction and a plurality of scanning lines 15 arranged in the second direction. The sub-pixels 21 of the plurality of pixels 20 are arranged in an array, and each sub-pixel 21 is located between the adjacent scanning lines 15 and between the adjacent data lines 14. The display region 12 surrounds the hollow region 11a and the first non-display region 11. Each data line 14 is electrically connected to the sub-pixels 21 in a respective one of the columns of the sub-pixel array. Therefore at least one of the plurality of data lines 14 includes a segment in the first non-display region 11. This segment extends non-linearly in the first non-display region 11 so as to pass around the hollowed region 11a, that is, this segment is outside the hollowed region 11a and does not overlap with the hollowed region 11a. Each data line 14 not overlapping the first non-display region 11 (that is, not having a segment in the first non-display region 11) extends in the second direction. For example, as shown in FIG. 3, optionally, the hollowed region 11a may be a circular hole, and the segment of the data line 14 in the first non-display region 11 extends in the first non-display region 11 in an arc manner, and the data line 14 in the display region 12 extends along the second direction.

The data lines 14 overlapping the first non-display region 11 may be disposed in different layers in a stacked manner and insulated from each other, so that the distance between any two adjacent data lines 14 in the first non-display region 11 is shortened, the area occupied by the first non-display region 11 is decreased, and the full screen is achieved. Specifically, in the first non-display region, at least two data lines are stacked and insulated, and orthogonal projections of the at least two data lines 14 on the plane of the base substrate 10 are at least adjacently disposed, so that the area occupied by the first non-display region 11 is decreased, and a full screen is further achieved.

FIGS. 4 to 6 show three configuration schemes of the data lines having segments in the first non-display region. As shown in FIG. 4, the orthogonal projections of the at least two data lines 14 on the plane of the base substrate 10 coincide (that is, completely overlap). As shown in FIG. 5, the orthogonal projections of the at least two data lines 14 on the plane of the base substrate 10 partially overlap. As shown in FIG. 6, the orthogonal projections of the at least two data lines 14 on the plane of the base substrate 10 are adjacently disposed, that is, the distance between the orthogonal projection of the data line 14 arranged in an upper layer and the orthogonal projection of the data line 14 arranged in a lower layer is substantially 0.

The plurality of data lines 14 are arranged in the first direction, and charge the sub-pixels 21 in the plurality of pixels 20 sequentially and respectively. When m=3, each adjacent three data lines 14 charge a column of pixels 20. Specifically, the adjacent three data lines 14 charges red sub-pixels R, green sub-pixels G, and blue sub-pixels B in the column of pixels 20 respectively. The data lines 14 charging the sub-pixels 21 of the same color are charged simultaneously, so there is no coupling influence. The data lines 14 charging sub-pixels 21 of different colors are not charged simultaneously, so there is a coupling influence. The data lines 14 overlapping the first non-display region 11 are disposed in the same layer or in different layers in the stacked manner and insulated from each other. The interval between the data lines 14 in the same layer or in different layers is very small, so the overlapping capacitance between the data lines 14 is larger. Each data lines 14 not only has a coupling influence with two adjacent data lines 14 in the same layer, but also has a coupling influence with two adjacent data lines 14 which are disposed in the layer different from the layer where the data lines 14 is disposed and used for charging sub-pixels of different colors. That is, the data line 14 overlapping the first non-display region 11 is influenced by the coupling effects caused by four adjacent data lines 14 each of which charges sub-pixels emitting lights of a color different from the sub-pixels charged by the data line 14.

In the embodiment, the plurality of scanning lines 15 do not intersect each other in the first direction, and the number of pixels driven by one scanning line 15 is the number of pixels included in one row of pixels 20. At least one scanning line 15 includes the first scanning lead 15a, two adjacent pixels 20 in at least one row of pixels 20 are respectively connected to two adjacent first scanning leads 15a, and the first scanning lead 15a extends alternating in the first direction and the second direction, and is electrically connected to a first side of each pixel 20 electrically connected correspondingly. In the embodiment, the first scanning lead 15a of the scanning line 15 extends in a bent manner, the pixels 20 driven by the first scanning lead 15a are distributed in two adjacent rows of pixels 20, the number of pixels driven by one scanning line 15 is equal to the number of pixels included in one row of pixels 20, and the first scanning lead 15a which extends alternating in the first direction and the second direction does not intersect any other scanning line 15.

As shown in FIG. 2, the first scanning lead 15a includes a plurality of first connection line segments 151 extending in the first direction and a plurality of second connection line segments 152 extending in the second direction, each first connection line segment 151 is located on a first side of a corresponding pixel 20, each second connection line segment 152 is located on a third side or a fourth side of a corresponding pixel 20, the third side of the pixel 20 and the fourth side of the pixel 20 are opposite to each other and intersect the first side. Each second connection line segment 152 is used for electrically connecting two adjacent first connection line segments 151. In the embodiment, optionally, the first side, the second side, the third side and the fourth side of the pixel 20 are the lower side, the upper side, the left side and the right side of the pixel 20, respectively.

In the embodiment, the problem of vertical lines in a worse pattern caused by overlapping of the data lines 14 can be improved with the configuration that the first scanning lead 15a extends alternately in the first direction and the second direction.

Figure 7:
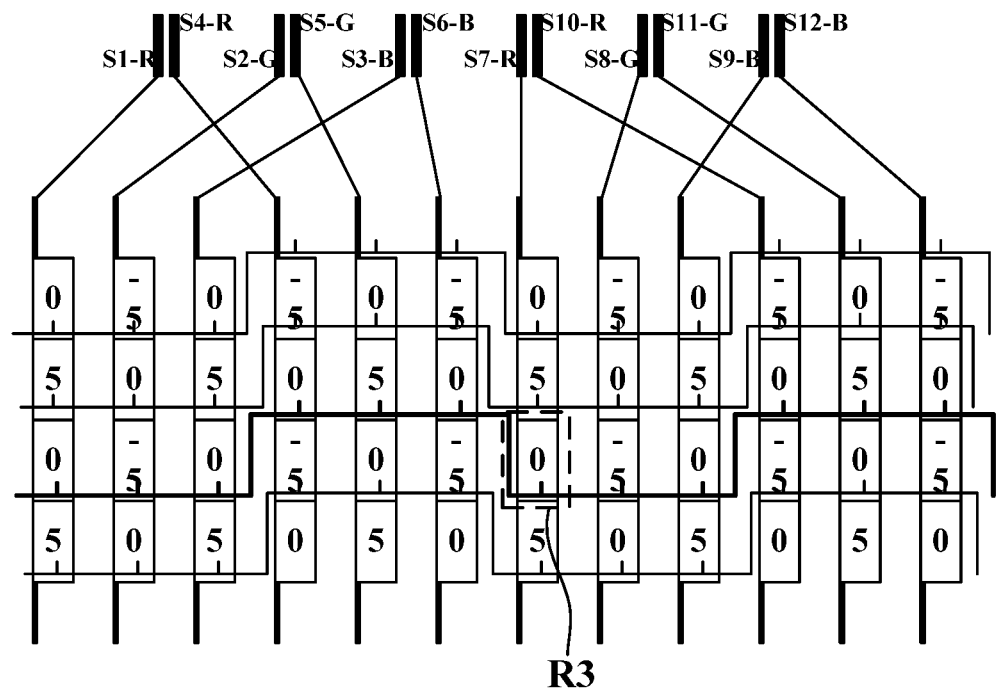
FIG. 7 is a schematic diagram of a part of the display panel shown in FIG. 1.

The pixel charging process is as follows. The red sub-pixels R are charged firstly. After the red sub-pixels R are charged, the data lines connected to the red sub-pixels R are in a floating state. Then, the green sub-pixels G are charged. The signal jumping of the data lines connected to the green sub-pixels G affects the voltage of the data lines connected to the red sub-pixels R and further affects the brightness of the red sub-pixels R. After the green sub-pixels G are charged, the data lines connected to the green sub-pixels G are in the floating state. Then, the blue sub-pixels B are charged finally, the signal jumping of the data lines connected to the blue sub-pixels B affects the voltages of the data lines connected to adjacent green sub-pixels G and the data lines connected to adjacent red sub-pixels R and further affects the brightness of the adjacent red sub-pixels R and the adjacent green sub-pixels G. After the blue sub-pixels B are charged, the data lines connected to the blue sub-pixels B are in the floating state. When the red sub-pixels R in the next row are charged, the signal on the scanning line of the previous row is a disabled signal, so the blue sub-pixels B are not influenced. Specifically, as shown in FIG. 4 and FIG. 7, the red sub-pixel R3 and the dot inversion are used as an example for description, the data line S7 for the red sub-pixel R3 is adjacent to the data line S8 and the data line S11 tier charging the green sub-pixels G, and is also adjacent to the data line S3 and the data line S6 for charging the blue sub-pixels B, so when the data line S7 is in the floating state, the voltage of the data line S7 is influenced by jumping of the data signal of each of the data line S8, the data line S11, the data line S3, and the data line S6.

Specifically, after the red sub-pixel R3 is charged, the green sub-pixels G are charged, the data line S8 and the data line S11 start to charge corresponding green sub-pixels G respectively. The data signal of the data line S8 is changed from 0V to −5V in a decreasing trend, and the potential of the data line S7 is pulled down accordingly. The data signal of the data line S11 is changed from 0V to 5V in an increasing trend, and the potential of the data line S7 is pulled up. The pulled-down potential amplitude of the data line S7 caused by the data line S8 and the pulled-up potential amplitude of the data line S7 caused by the data line S11 can be mutually compensated, so that the potential of the data line S7 remains almost unchanged when the green sub-pixels are charged.

After the charging of the green sub-pixel G is completed, the blue sub-pixels B are charged. The data line S3 and the data line S6 are used for charging corresponding blue sub-pixels B respectively. The data signal of the data line S3 is changed from 5V to 0V in the decreasing trend, and the potential of the data line S7 is pulled down. The data signal of the data line S6 is changed from −5V to 0V in the increasing trend, and the potential of the data line S7 is pulled up. The pulled-down potential amplitude of the data line S7 caused by the data line S3 and the pulled-up potential amplitude of the data line S7 caused by the data line S6 can be mutually compensated, so that the potential of the data line S7 remains almost unchanged when the blue sub-pixels are charged. Therefore, the brightness of the red sub-pixel R is not influenced by the charging of the green sub-pixel G and the charging of the blue sub-pixel B.

Similarly, the brightness of the green sub-pixel G is not influenced by the charging of the blue sub-pixel B.

Apparently, the brightness of any red sub-pixel and any green sub-pixel which are electrically connected to the first scanning lead is not influenced by the charging of the adjacent sub-pixels, avoiding the problem of mutual interference between the sub-pixels charged at different time, and therefore the picture has no color difference and the display effect is improved. In the embodiment, the problem of vertical lines during picture refreshing caused by overlapping of the data lines 14 can be improved with the first scanning lead 15a which extends alternately in the first and second directions.

It is to be noted that the display panel and the extending configuration of the first scanning lead provided by the embodiment are applicable to a dot inversion mode, a pixel inversion mode and a row inversion mode. Optionally, in one frame of the display picture, the data signal polarity of any sub-pixel is different from the data signal polarity of each adjacent sub-pixel; or in one frame of the display picture, the data signal polarity of any pixel is different from the data signal polarity of each adjacent pixel. Optionally, in one frame of the display picture, the data signal polarity of any row of pixels is different from the data signal polarity of any adjacent row of pixels. In the embodiment, regardless of whether the inversion mode of the data signal in the display panel is the dot inversion mode, the pixel inversion mode or the row inversion mode, the first scanning lead which extends alternately in the first and second directions can ensure that the brightness of the red sub-pixel is not influenced by the green sub-pixel and the blue sub-pixel, and that the brightness of the green sub-pixel is not influenced by the blue sub-pixel, solving the problem of charging interference between the sub-pixels charged at different time, achieving the effect of no color difference in a picture, and even improving the problem of vertical lines during picture refreshing.

Figure 8:
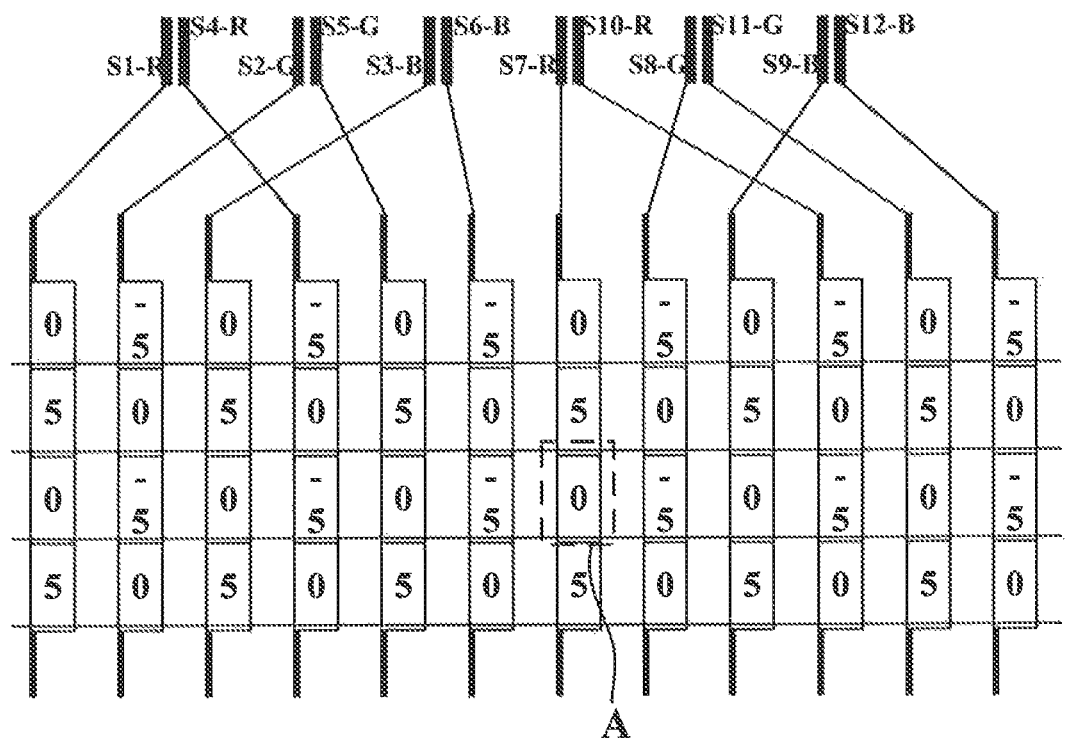
FIG. 8 is a schematic diagram of a display panel according to the related art.

As shown in FIG. 8, in the related art, a scanning line corresponds to and is electrically connected to a row of sub-pixels, and all sub-pixels in a same row are electrically connected to a same scanning line. The data lines S11 to S12 all overlap the first non-display region. The potential of the data line S7 is influenced by the data line S8 and the data line S11 of the adjacent green sub-pixels. For the pixel A, the potential of the data line S7 is pulled down when the data line S8 is changed from 0V to −5V, and the potential of the data line S7 is also pulled down when the data line S11 is changed from 5V to 0V. The potential of the data line S7 is also influenced by the data line S3 and the data line S6 of the adjacent blue sub-pixels, the potential of the data line S7 is pulled down when the data line S3 is changed from 5V to 0V, the potential of the data line S7 is also pulled down when the data line S6 is changed from 0V to −5V. When the sub-pixel is charged by a voltage with a negative polarity and configured to emit white light, four adjacent data lines each will pull down the potential of the data line S7, the potential pull-down causes increasing of the brightness, and therefore the brightness of the red sub-pixel A is significantly increased. Similarly, the brightness of the green sub-pixel G is significantly increased, the brightness of the blue sub-pixel is unchanged, and the picture is more yellow. Apparently, the problem of display color difference exists in the related art.

In the embodiment, the scanning line includes the first scanning lead, and the first scanning lead is configured to extend alternately in the first and second directions. When the data line of the charged sub-pixel is in a floating state, the influences of the potential changings of other adjacent data lines, whose charging times are different from the charging time of the data line of the charged sub-pixel, on the data line of the charged sub-pixel can be mutually compensated, so the potential of the data line of the charged sub-pixel remains almost unchanged, avoiding the mutual interference between the sub-pixels which emit different color lights and are not simultaneously charged, improving the problem of display color difference caused by large overlapping capacitance of the data lines, and improving the display effect of a full screen with a round hole.

Exemplarily, on the basis of the above technical solution, optionally, in the first non-display region, for at least two data lines transmitting data signals to sub-pixels of the same color, their orthogonal projections on the plane of the base substrate are at least adjacently disposed. In the embodiment, as shown in FIG. 4 and FIG. 7, the data lines S1, S4, S7 and S10 transmit data signals to the red sub-pixels R respectively, the data lines S2, S5, S8 and S11 transmit data signals to the green sub-pixels G respectively, the data lines S3, S6, S9 and S12 transmit data signals to the blue sub-pixels B respectively. Optionally, orthogonal projections of the data line S1 and the data line S4 on the plane of the base substrate coincide, orthogonal projections of the data line S2 and the data line S5 on the plane of the base substrate coincide, and so on. In other embodiments, for at least two data lines transmitting data signals to sub-pixels of the same color, their orthogonal projections on the plane of the base substrate are at least adjacently disposed, or their orthogonal projections on the plane of the base substrate are at least partially overlapped.

Since the sub-pixels of the same color in the same row are charged simultaneously, the at least two data lines whose orthogonal projections are at least adjacently disposed simultaneously provide data signals to respective sub-pixels of the same color, reducing charging coupling effects and crosstalk between the at least two data lines, and thereby improving the problem of undesired vertical lines in a worse pattern in the related art.

On this basis, the configuration that the first scanning lead extends alternately in the first and second directions can ensure that the brightness of the red sub-pixel is not influenced by the green sub-pixel and the blue sub-pixel, and that the brightness of the green sub-pixel is not influenced by the blue sub-pixel, and thus the problem of mutual interference between the sub-pixels charged at different time is solved, the effect of images without color difference is achieved, and even the problem of vertical lines during picture refreshing is improved. Further, the mutual interference between the sub-pixels which emit different color lights and are charged at different times is avoided, the problem of display color difference caused by large overlapping capacitance of the data lines is improved, and the display effect of a full screen with a round hole is improved.

Optionally, the pixel includes a first side and a second side opposite to each other and parallel to the first direction, and the first scanning lead is electrically connected to multiple pixels via their the first sides. Alternatively, as shown in FIG. 2, the first scanning lead 15a is electrically connected to the multiple pixels via their the second sides. As shown in FIG.

1, the display panel further includes a driver chip 30. The driver chip 30 is disposed in the second non-display region 13, and located on a short edge of the display panel remote from the first non-display region 11. The second side of the pixel 20 is closer to the driver chip 30 than the first side of the pixel 20. The arrangement direction of the first scanning lines 15a is perpendicularly to the first side or the second side of the pixel 20. As shown in FIG. 2, the first scanning line 15a is electrically connected to the second side of each pixel 20 that is electrically connected to the first scanning line 15a, that is, the first scanning lead 15a is electrically connected to the second sides of the sub-pixels in each pixel 20 electrically connected to the first scanning line 15a. In other embodiments, the first scanning lead is electrically connected to the first side of each pixel 20 electrically connected to the first scanning line 15a.

Optionally, the sub-pixel 21 includes a third side (left side) and a fourth side (right side) opposite to each other and parallel to the second direction, each data line 14 is located on the left side of a column of sub-pixels 21 electrically connected to the data line 14. Alternatively, each data line 14 is located on the right side of the column of sub-pixels 21 electrically connected to the data line 14. It is to be noted that the display panel includes long sides and short sides, and the driver chip 30 is disposed on the short side. In the embodiment, the first and second sides of the pixel 20 are parallel to the short side, and the third and fourth sides of the pixel 20 are parallel to the long side. The extending direction of the data line 14 is generally parallel to the long side direction of the display panel, so the data line 14 is generally electrically connected to the third side (left side) or the fourth side (right side) of the corresponding sub-pixel.

As shown in FIG. 2, optionally, at least one first scanning lead 15a is electrically connected to odd-numbered pixels 20 in a row (that is, pixels 20 at intersections between this row and odd-numbered columns), and is also electrically connected to even-numbered pixels 20 in the previous row (that is, pixels 20 at intersections between the previous row and even-numbered columns). Alternatively, as shown in FIG. 8, the at least one first scanning lead 15a is electrically connected to the odd-numbered pixels in one row of pixels 20, and is also electrically connected to even-numbered pixels of the next row of pixels 20.

In the embodiment, if at least one row of pixels 20 each has two adjacent pixels 20 which are respectively connected to two adjacent first scanning lines 15a, each first scanning line 15a may be electrically connected to odd-numbered pixels 20 in the corresponding row of pixels 20, and is electrically connected to even-numbered pixels 20 in the previous row of pixels 20. Alternatively, each first scanning lead 15a is electrically connected to the odd-numbered pixels 20 in the corresponding row of pixels 20, and is electrically connected to even-numbered pixels 20 in the next row of pixels 20. Compared with the existing configuration manner of the scanning lines, the embodiment can solve the problem of the color differences caused by large overlapping capacitance of the data lines just by adding an additional scanning line.

Figure 9:
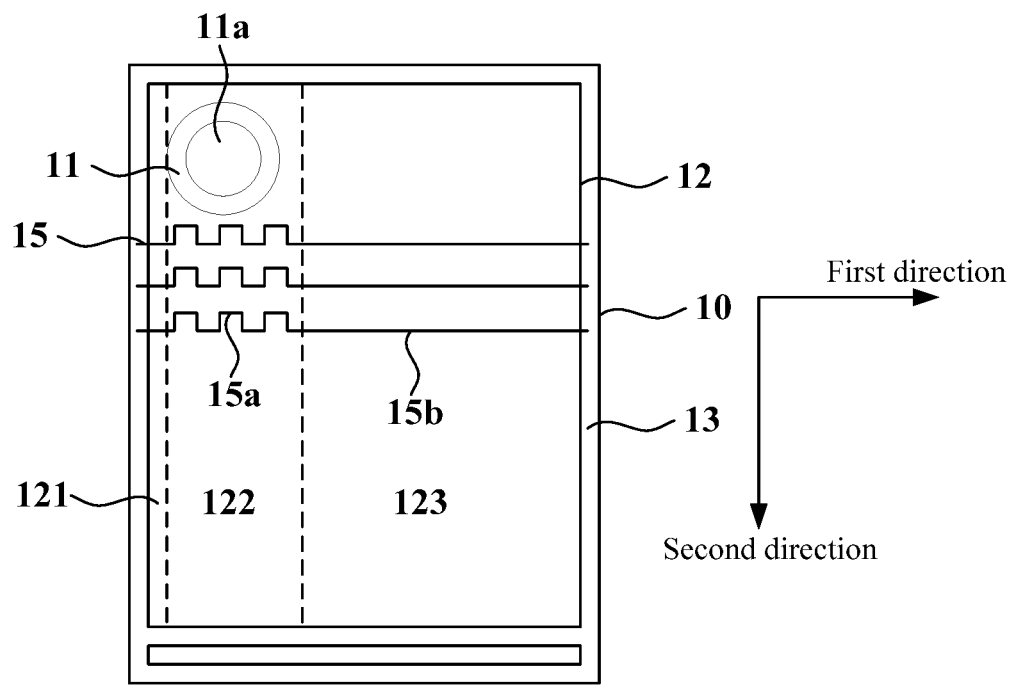
FIG. 9 is a schematic diagram of a display panel according to an embodiment of the present disclosure.

Exemplarily, on the basis of the above technical solution, as shown in FIG. 9, the display region includes a first display region 121, a second display region 122, and a third display region 123 which are sequentially arranged in the first direction. The second display region 122 is located on the periphery of the first non-display region 11, and the orthogonal projection of the first scanning lead 15a on the plane of the base substrate 10 at least partially overlaps the orthogonal projection of the second display region 122 on the plane of the base substrate 10.

Orthogonal projections of the data lines 14 overlapping the first non-display region 11 on the plane of the base substrate 10 are at least adjacently disposed, so the overlapping capacitance of the adjacent data lines 14 is large, and the color difference easily occurs. Apparently, a phenomenon of mutual charging potential interference between sub-pixels charged at different time exists in the second display region 122.

In the embodiment, the configuration of the first scanning lead 15a can improve the phenomenon of the mutual charging potential interference among the sub-pixels charged at different times. Therefore, the orthogonal projection of the first scanning lead 15a on the plane of the base substrate 10 at least partially overlaps the orthogonal projection of the second display region 122 on the plane of the base substrate 10, so that the problem of mutual charging potential interference among the sub-pixels charged at different time in the second display region 122 can be solved, the picture has no color difference, and the display effect is improved.

As shown in FIG. 9, optionally, the scanning line 15 further includes a second scanning lead 15b which is electrically connected to the first scanning lead 15a, and the second scanning lead 15b straightly extends in the first direction. The number of pixels driven by the scanning line 15 is the number of pixels included in one row of pixels 20. The first scanning lead 15a of the scanning line 15 extends alternately in the first and second directions, and the pixels 20 driven by the first scanning lead 15a are distributed in two adjacent rows of pixels 20. When the number of pixels driven by the first scanning lead 15a is less than the number of pixels of one row of pixels 20, the scanning line 15 also needs to extend to make the number of pixels driven by the scanning line 15 equal to the number of pixels included in one row of pixels 20. The scanning lines 15 do not intersect each other. Optionally, the second scanning line 15b extends straightly in the first direction, and is electrically connected to other pixels 20 in the corresponding row of pixels 20. It is to be noted that the scanning lines 15 in the display panel are arranged in the second direction, at least one scanning line 15 overlaps the first non-display region 11, and the scanning lines 15 in the first non-display region 11 extend around the hollow region 11a to pass through the first non-display region 11.

In other embodiments, the entire display region is covered by the first scanning leads.

Figure 10:
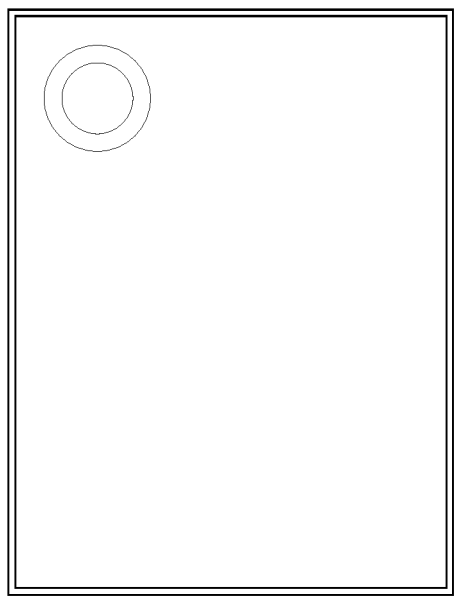
FIG. 10 is a schematic diagram of an electronic device according to an embodiment of the present disclosure.

An embodiment of the present disclosure further provides an electronic device, and the electronic device includes the display panel described in any one of above-mentioned embodiments. As shown in FIG. 10, the electronic device is provided with a full screen, the first non-display region is surrounded by the display region, and orthogonal projections of the data lines in the first non-display region are at least adjacently disposed on the plane of the base substrate. Meanwhile, the scanning lines include one or more first scanning leads. For at least one row of pixels, two adjacent pixels in the same row are respectively connected to two adjacent first scanning leads. The first scanning lead extends alternately in the first and second directions, and is electrically connected to the first side of each pixel electrically connected to the first scanning lead. The charging coupling effect between the sub-pixels is reduced, the mutual interference between the sub-pixels which emit different color lights and are not charged simultaneously is reduced, the display color difference caused by large overlapping capacitance of the data lines is improved, and the display effect of the full screen with a round hole is improved. The electronic device may be a mobile phone and other electronic display devices.

It is to be noted that the above are merely exemplary embodiments of the present disclosure and the technical principles used therein. It can be understood by those skilled in the art that the present disclosure is not limited to the specific embodiments described herein. Those skilled in the art can make various modifications, adaptations, combinations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising: a base substrate, a first non-display region, a display region located on a periphery of the first non-display region, a plurality of data lines arranged in a first direction and a plurality of scanning lines arranged in a second direction, wherein the first direction and the second direction intersect each other;
wherein the display region comprises a plurality of pixels arranged in rows and columns, each of the plurality of pixels comprises in sub-pixels configured to emit light in different colors, each of the m sub-pixels is located between two adjacent ones of the plurality of scanning lines and between two adjacent ones of the plurality of data lines, the sub-pixels of the plurality of pixels are arranged in rows and columns, the sub-pixels in each column are electrically connected to a respective one of the plurality of data lines, and in is equal to 3 or 4;
wherein in the first non-display region, at least two of the plurality of data lines are arranged in different layers and insulated, and orthogonal projections of the at least two of the plurality of data lines on a plane of the base substrate are at least adjacently disposed; and
wherein the plurality of scanning lines do not intersect each other, at least two of the plurality of scanning lines each comprise a first scanning lead, wherein for at least one of the rows, two adjacent pixels are respectively connected to two adjacent first scanning leads, and the first scanning lead extends alternately in the first and second directions, wherein the first scanning lead is electrically connected to two or more of the plurality of pixels at a first side of the two or more pixels;
wherein the scanning line further comprises a scanning lead electrically connected to the first scanning lead, and the second scanning lead straightly extends along the first direction.

2. The display panel of claim 1, wherein in the first non-display region, the orthogonal projections of the at least two of the plurality of data lines on the plane of the base substrate at least partially overlap one another.

3. The display panel of claim 1, wherein each of the plurality of pixels comprises a first side and a second side opposite to each other and parallel to the first direction, the first scanning lead is electrically connected to the two or more pixels at the first sides of the two or more pixels, or the first scanning lead is electrically connected to the two or more pixels at the second sides of the two or more pixels.

4. The display panel of claim 1, wherein at least one first scanning lead is electrically connected to odd-numbered pixels of a row of pixels and is also electrically connected to even-numbered pixels of a previous row of pixels; or the at least one first scanning lead is electrically connected to odd-numbered pixels of the row of pixels and is also electrically connected to even-numbered pixels of a next row of pixels.

5. The display panel of claim 1, wherein the display region comprises a first display region, a second display region and a third display region which are sequentially arranged along the first direction, the second display region is located on the periphery of the first non-display region, and an orthogonal projection of the first scanning lead on the plane of the base substrate at least partially overlaps an orthogonal projection of the second display region on the plane of the base substrate.

6. The display panel of claim 1, wherein in one frame of display picture, a data signal polarity of any sub-pixel is different from a data signal polarity of each adjacent sub-pixel; or
in one frame of display picture, a data signal polarity of any row of the plurality of pixels is different from a data signal polarity of any adjacent row of the plurality of pixels.

7. The display panel of claim 1, wherein m is equal to 3, each of the plurality of pixels comprises a red sub-pixel, a green sub-pixel, and a blue sub-pixel; or
m is equal to 4, and each of the plurality of pixels comprises the red sub-pixel, the green sub-pixel, the blue sub-pixel, and a white sub-pixel.

8. The display panel of claim 1, wherein each of the m sub-pixels comprises a left side and a right side which are disposed opposite to each other and parallel to the second direction, and each of the plurality of data lines is electrically connected to a respective one of the columns of sub-pixels and is located on a left side of the respective one of the columns of sub-pixels; or each of the plurality of data lines is located on a right side of the respective one of the columns of sub-pixels.

9. The display panel of claim 1, wherein the plurality of data lines comprise at least two data lines which are configured to transmitting data signals to the sub-pixels of a same color and each of which has a segment in the first non-display region, orthogonal projections of the at least two data lines on the plane of the base substrate are at least adjacently disposed.

10. An electronic device, comprising a display panel, wherein the display panel comprises: a base substrate, a first non-display region, a display region located on a periphery of the first non-display region, a plurality of data lines arranged in a first direction and a plurality of scanning lines arranged in a second direction intersecting the first direction;
wherein the display region comprises a plurality of pixels arranged in rows and columns, each of the plurality of pixels comprises m sub-pixels configured to emit light in different colors, each of the m sub-pixels is located between two adjacent ones of the plurality of scanning lines and between two adjacent ones of the plurality of data lines, the sub-pixels of the plurality of pixels are arranged in rows and columns, the sub-pixels in each column are electrically connected to a respective one of the plurality of data lines, and m is equal to 3 or 4;
wherein in the first non-display region, at least two of the plurality of data lines are arranged in different layers and insulated, and orthogonal projections of the at least two of the plurality of data lines on a plane of the base substrate are at least adjacently disposed; and wherein the plurality of scanning lines do not intersect each other, at least two of the plurality of scanning lines each comprise a first scanning lead, wherein for at least one of the rows, two adjacent pixels are respectively connected to two adjacent first scanning leads, and the first scanning lead extends alternately in the first and second directions, wherein the first scanning lead is electrically connected to two or more of the plurality of pixels at a first side of the two or more pixels;

wherein the scanning line further comprises a second scanning lead electrically connected to the first scanning lead, and the second scanning lead straightly extends along the first direction.

11. The electronic device of claim 10, wherein in the first non-display region, the orthogonal projections of the at least two of the plurality of data lines on the plane of the base substrate at least partially overlaps one another.

12. The electronic device of claim 10, wherein each of the plurality of pixels comprises a first side and a second side opposite to each other and parallel to the first direction, the first scanning lead is electrically connected to the two or more pixels at the first sides of the two or more pixels, or the first scanning lead is electrically connected to the two or more pixels at the second sides of the two or more pixels.

13. The electronic device of claim 10, wherein at least one first scanning lead is electrically connected to odd-numbered pixels of a row of pixels and is also electrically connected to even-numbered pixels of a previous row of pixels; or the at least one first scanning lead is electrically connected to odd-numbered pixels of the row of pixels and is also electrically connected to even-numbered pixels of a next row of pixels.

14. The electronic device of claim 10, wherein the display region comprises a first display region, a second display region and a third display region which are sequentially arranged along the first direction, the second display region is located on the periphery of the first non-display region, and an orthogonal projection of the first scanning lead on the plane of the base substrate at least partially overlaps an orthogonal projection of the second display region on the plane of the base substrate.

15. The electronic device of claim 10, wherein in one frame of display picture, a data signal polarity of any sub-pixel is different from a data signal polarity of each adjacent sub-pixel; or in one frame of display picture, a data signal polarity of any row of the plurality of pixels is different from a data signal polarity of any adjacent row of the plurality of pixels.

16. The electronic device of claim 10, wherein m is equal to 3, each of the plurality of pixels comprises a red sub-pixel, a green sub-pixel, and a blue sub-pixel; or m is equal to 4, and each of the plurality of pixels comprises the red sub-pixel, the green sub-pixel, the blue sub-pixel, and a white sub-pixel.

17. The electronic device of claim 10, wherein each of the m sub-pixels comprises a left side and a right side which are disposed opposite to each other and parallel to the second direction, and each of the plurality of data lines is electrically connected to a respective one of the columns of sub-pixels and is located on a left side of the respective one of the columns of sub-pixels; or each of the plurality of data lines is located on a right side of the respective one of the columns of sub-pixels.

18. The electronic device of claim 10, wherein the plurality of data lines comprise at least two data lines which are configured to transmitting data signals to the sub-pixels of a same color and each of which has a segment in the first non-display region, orthogonal projections of the at least two data lines on the plane of the base substrate are at least adjacently disposed.

* * * * *